(12) United States Patent
Lu et al.

(10) Patent No.: US 12,538,430 B2
(45) Date of Patent: Jan. 27, 2026

(54) METHOD FOR MANUFACTURING SEMI-FLEX PRINTED CIRCUIT BOARD

(71) Applicant: TRIPOD (WUXI) ELECTRONIC CO., LTD., WuXi (CN)

(72) Inventors: Cheng Ming Lu, WuXi (CN); Han-Ching Shih, WuXi (CN); Hsu Tu, WuXi (CN); Wen-Che Chen, WuXi (CN); Wu-Chiang Ma, WuXi (CN)

(73) Assignee: TRIPOD (WUXI) ELECTRONIC CO., LTD., WuXi (CN)

(*) Notice: Subject to any disclaimer, the term of this patent is extended or adjusted under 35 U.S.C. 154(b) by 341 days.

(21) Appl. No.: 18/363,921

(22) Filed: Aug. 2, 2023

(65) Prior Publication Data
US 2024/0049396 A1 Feb. 8, 2024

(30) Foreign Application Priority Data
Aug. 3, 2022 (CN) .......................... 202210926097.3

(51) Int. Cl.
H05K 3/00 (2006.01)
H05K 1/02 (2006.01)
H05K 3/06 (2006.01)

(52) U.S. Cl.
CPC ......... *H05K 3/0044* (2013.01); *H05K 1/0278* (2013.01); *H05K 3/0026* (2013.01);
(Continued)

(58) Field of Classification Search
None
See application file for complete search history.

(56) References Cited

U.S. PATENT DOCUMENTS 11,222,867 B1* 1/2022 Huang .................... H01L 24/08
2008/0043067 A1* 2/2008 Nayve .................... B41J 2/1631
347/68

(Continued)

FOREIGN PATENT DOCUMENTS

KR 20070047219 A 5/2007
WO 2008098270 A1 8/2008

OTHER PUBLICATIONS

USPTO First Office Action in U.S. Appl. No. 18/364,013 dated Apr. 21, 2025, 19 pages
(Continued)

*Primary Examiner* — Binh X Tran
(74) *Attorney, Agent, or Firm* — BROOKS KUSHMAN P.C.

(57) ABSTRACT

A method for manufacturing a semi-flex printed circuit board is provided, including: forming two convex metal dam structures and two concave laser cut grooves on a side surface of the core substrate; wherein inner sides of the two metal dam structures form a printing area at the side surface of the core substrate, and the positions of the two laser cut grooves correspond to the printing area; printing a strippable printing ink in the printing area on the core substrate; laminating a build-up board structure on the side surface of the core substrate; and forming two blind routing openings on another side surface of the core substrate, which correspond to the two laser cut grooves in position respectively; removing a cover-opening structure of the core substrate between the two blind routing openings, so as to form a cover-opening opening.

8 Claims, 4 Drawing Sheets

(52) U.S. Cl.
CPC ......... *H05K 3/0055* (2013.01); *H05K 3/0058* (2013.01); *H05K 3/06* (2013.01); *H05K 2203/0228* (2013.01); *H05K 2203/107* (2013.01); *H05K 2203/308* (2013.01)

(56) References Cited

U.S. PATENT DOCUMENTS

| | | |
|---|---|---|
| 2018/0200992 A1 | 7/2018 | Schönholz |
| 2020/0043855 A1* | 2/2020 | Lu .......................... H01L 21/565 |
| 2021/0045249 A1 | 2/2021 | Tuominen et al. |
| 2022/0039259 A1* | 2/2022 | Xin ..................... H05K 3/4691 |
| 2023/0230849 A1* | 7/2023 | Cheng .................... H01L 24/24 |
| | | 438/459 |

OTHER PUBLICATIONS

Amendment Under 37 C.F.R. § 1.111 in U.S. Appl. No. 18/364,013 dated Jul. 8, 2025, 10 pages
USPTO Final Office Action in U.S. Appl. No. 18/364,013 dated Jul. 17, 2025, 8 pages
Extended European Search Report for Application No. 23156098.8, dated Aug. 31, 2023, 8 Pages

* cited by examiner

METHOD FOR MANUFACTURING SEMI-FLEX PRINTED CIRCUIT BOARD

CROSS-REFERENCE TO RELATED APPLICATION

This application claims foreign priority benefits under 35 U.S.C. § 119(a)-(d) to Chinese patent application number CN 202210926097.3, filed Aug. 3, 2022, which is hereby incorporated by reference herein in its entirety.

TECHNICAL FIELD

The present disclosure relates to a method for manufacturing a circuit board, in particular to a method for manufacturing a semi-flex printed circuit board.

BACKGROUND

In an existing manufacturing process for a circuit board, strippable ink may be mixed with prepreg at an edge of a cover-opening opening after a cover-opening operation, which results in difficulty in stripping off the strippable ink when cleaning. Moreover, in the existing art, an angle of the edge of the cover-opening opening is affected by laser, which causes medicine liquid exchanging problem, resulting in a long stripping off time for the strippable ink; also, there is a risk that the strippable ink may be remained, which may affect the electrical characteristics of the finished circuit board.

Therefore, how to provide a cover-opening method of a circuit board to overcome the above-mentioned defects has become one of the important issues to be solved in this industry.

SUMMARY

The technical problem to be solved by the disclosure is to provide a method for manufacturing a semi-flex printed circuit board aiming at the shortcomings of the existing art.

In order to solve the above technical problems, one of the technical solutions adopted by the present disclosure is to provide a method for manufacturing a semi-flex printed circuit board, which includes: providing a core substrate; forming two convex metal dam structures and two concave laser cut grooves on a side surface of the core substrate; wherein inner sides of the two metal dam structures form a printing area at the side surface of the core substrate, and the positions of the two laser cut grooves correspond to the printing area and are closely adjacent to the inner sides of the two metal dam structures respectively; printing a strippable printing ink in the printing area on the core substrate, wherein the strippable printing ink is capable of being filled in the two laser cut grooves during a printing process; laminating a build-up board structure on the side surface of the core substrate; and blind routing another side surface of the core substrate to form two blind routing openings, which correspond to the two laser cut grooves in position respectively; removing a cover-opening structure of the core substrate between the two blind routing openings, so as to form a cover-opening opening, and the cover-opening structure is separated from the build-up board structure from positions of the two laser cut grooves; and removing residual ink located at the bottom of the cover-opening opening.

One of the beneficial effects of the present disclosure is that the method for manufacturing the semi-flex printed circuit board provided by the present disclosure can solve the problem that strippable printing ink is difficult to strip off and reduce the possibility of the strippable printing ink residue by the technical solution of "forming two convex metal dam structures and two concave laser cut grooves on a side surface of the core substrate; wherein inner sides of the two metal dam structures form a printing area at the side surface of the core substrate, and the positions of the two laser cut grooves correspond to the printing area and are closely adjacent to the inner sides of the two metal dam structures respectively; printing a strippable printing ink in the printing area on the core substrate, wherein the strippable printing ink is capable of being filled in the two laser cut grooves during a printing process; laminating a build-up board structure on the side surface of the core substrate; and blind routing another side surface of the core substrate to form two blind routing openings, which correspond to the two laser cut grooves in position respectively; removing a cover-opening structure of the core substrate between the two blind routing openings, so as to form a cover-opening opening, and the cover-opening structure is separated from the build-up board structure from positions of the two laser cut grooves; and removing residual ink located at the bottom of the cover-opening opening".

To further understand the features and technical content of the present disclosure, please refer to the following detailed description and drawings of the present disclosure. However, the drawings provided are only for reference and explanation, and are not intended to limit the present disclosure.

EXPLANATIONS OF SIGNS

1: Core substrate
2: Metal dam structure
21: Metal dam sidewall
3: Laser cut groove
31: Laser cutting sidewall
4: Metal circuit pattern
5: Bonding sheet
6: Core board
M: Metal cover layer R: Printing area
W: Width
H: Height
I: Strippable printing ink
I1: Residual ink
F: Blind routing milling cutter
F1: Blind routing opening
C: Cover-opening structure
C1: Cover-opening opening
α: Included angle

DETAILED DESCRIPTION

The following are specific embodiments to illustrate the implementations of the present disclosure, and those skilled in the art can understand the advantages and effects of the present disclosure from the disclosure of this specification. The present disclosure can be implemented or applied by other different specific embodiments, and various details in this specification can be modified and changed based on different viewpoints and applications without departing from the concept of the present disclosure. In addition, the drawings of the present disclosure are only simple and schematic illustrations but not drawn according to actual dimensions which are declared in advance. The following embodiments will further explain the related technical contents of the present disclosure in detail, but the disclosed contents are not intended to limit the scope of protection of the present disclosure.

It should be understood that although terms such as "first", "second" and "third" may be used herein to describe various elements or signals, these elements or signals should not be limited by these terms. These terms are mainly used to distinguish one element from another, or one signal from another. In addition, the term "or" used herein should possibly include any one or a combination of more of the associated, listed items according to the actual situation.

[Method for Manufacturing Semi-Flex Printed Circuit Board]

Referring to FIGS. 1 to 8, an embodiment of the present disclosure provides a method for manufacturing a semi-flex printed circuit, which includes steps S110, S120, S130, S140, S150, S160 and S170. It should be noted that the sequence of steps and the actual operation mode in the present embodiment can be adjusted as required, and it is not limited to the present embodiment.

The method for manufacturing the semi-flex printed circuit board of the embodiment of the present disclosure can provide additional operation(s) before, during or after each step, and some described operations may be replaced, eliminated or relocated to realize additional embodiments of the method. The method for manufacturing the semi-flex printed circuit board will be described below with reference to FIGS. 1 to 8.

Figure 1:
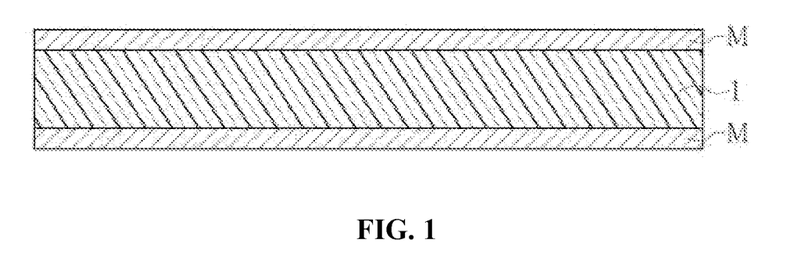
FIG. 1 is a schematic diagram of step S110 of a cover-opening method of a printed circuit board according to an embodiment of the present disclosure.

FIG. 1 is a schematic diagram of step S110 of a cover-opening method of a printed circuit board according to an embodiment of the present disclosure. The step S110 includes: providing a core substrate 1 (also called a core), and both side surfaces of the core substrate 1 are paved with metal cover layers M (such as metal copper foil).

Figure 2:
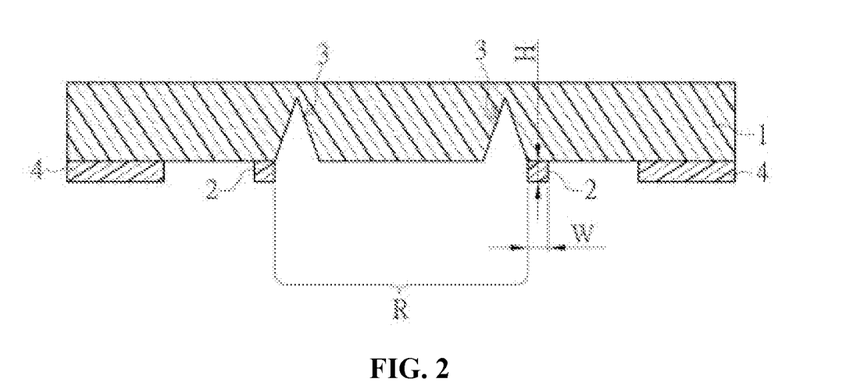
FIG. 2 is a schematic diagram of step S120 of the cover-opening method of the printed circuit board according to the embodiment of the present disclosure.

FIG. 2 is a schematic diagram of step S120 of the cover-opening method of the printed circuit board according to the embodiment of the present disclosure. The step S120 includes: performing a metal etching operation to form two protruding metal dam structures 2 and a metal circuit pattern 4 on one side surface of the core substrate 1; and performing a laser cutting operation to form two laser cut grooves 3 recessed from the side surface of the core substrate 1.

The inner sides of the two metal dam structures 2 surround and form a printing area R on the core substrate 1. The two laser cut grooves 3 are recessed from the side surface of the core substrate 1, and the positions of the two laser cut grooves 3 correspond to the printing area R, and are formed respectively closely adjacent to the inner sides of the two metal dam structures 2. That is, the core substrate 1 is provided with one laser cut groove 3 arranged closely adjacent to the inner side of each of the two metal dam structures 2. It is worth mentioning that the two metal dam structures 2 and the two laser cut grooves 3 in FIG. 2 are viewed from a cross section of the circuit board structure.

When viewed from a top view of the circuit board structure, the metal dam structure 2 can be, for example, two long strip dams to surround and form the printing area R, but the present disclosure is not limited thereto, and the metal dam structure 2 can also be, for example, a continuous ring structure (not shown) to surround and form the printing area R. Any structural design of the metal dam structure 2 capable of surrounding and forming the printing area R conforms to the protection spirit of the present disclosure and belongs to the scope of protection of the present disclosure.

More specifically, the metal etching operation is to etch the metal covering layer M on the core substrate 1 (e.g., by wet etching or dry etching) to remove part of the metal covering layer M, so as to form the two convex metal dam structures 2 on the core substrate 1.

It is worth mentioning that, after a part of the metal cover layer M is removed, the metal circuit pattern 4 is further formed on the core substrate 1; the metal circuit pattern is not located in the printing area R, but the present disclosure is not limited thereto. The metal circuit pattern 4 is configured to connect electronic components together and provide the printed circuit board with required electrical characteristics. Furthermore, it is worth mentioning that, the metal dam structure 2 can be a structure with a barrier function only, but it can also be, for example, another metal circuit pattern with both the barrier function and the electrical connection function.

Moreover, in each of the two metal dam structures 2, the material of the metal dam structure 2 is copper metal, and a cross section of the metal dam structure 2 is substantially rectangular (as shown in FIG. 2) or trapezoidal (not shown). A width W of the metal dam structure 4 is between 30 microns and 600 microns, preferably between 30 microns and 175 microns, and particularly preferably between 50 microns and 155 microns. A height H of the metal dam structure 2 is between 15 microns and 300 microns, and preferably between 17.5 microns and 280 microns.

In the laser cutting operation, a laser cutting machine (such as a PCB laser cutting machine) is used to cut the core substrate 1 to remove part of the material of the core substrate 1, so that the core substrate 1 can be formed with two concave laser cut grooves 3. In the present embodiment, each of the two laser cut grooves 3 is substantially V-shaped, but the present disclosure is not limited thereto. In addition, the depth of each of the two laser cut grooves 3 can be adjusted according to the design requirements of products.

Figure 3:
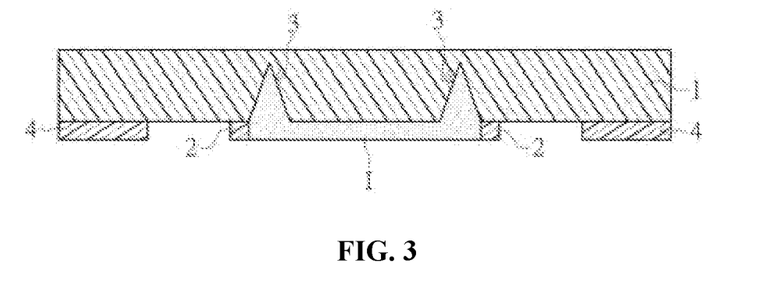
FIG. 3 is a schematic diagram of step S130 of the cover-opening method of the printed circuit board according to the embodiment of the present disclosure.

FIG. 3 is a schematic diagram of step S130 of the cover-opening method of the printed circuit board according to the embodiment of the present disclosure. The step S130 includes: performing a printing operation to print a strippable printing ink I in the printing area R located at the inner sides of the two metal dam structures 2 on the core substrate 1, and the strippable printing ink I can be further filled in the two laser cut grooves 3 during the printing process.

In the method for manufacturing the semi-flex printed circuit board according to the embodiment of the present disclosure, by means of the design of the metal dam structures 2 and the laser cut grooves 3, the occurrence of overflow of the strippable printing ink I in the printing process can be avoided, and the stripping efficiency and removing effect for the strippable printing ink I in the subsequent stripping operation can be assisted to improve.

More specifically, the metal dam structure 2 can prevent the strippable printing ink I from overflowing during the printing process; and the strippable printing ink I is filled in the laser cut grooves 3 during the printing process, which can also assist in preventing the strippable printing ink I from overflowing from the positions of the metal dam structures 2. Furthermore, the laser cut grooves 3 can assist in improving the stripping efficiency and removing effect to the strippable printing ink I in the subsequent stripping operation.

In connection to material types, the strippable printing ink I can be, for example, strippable ink, gold-finger protecting ink, electroplating-resistant ink, PI, PFG and the like which are commonly adopted for PCB, but is not limited to the materials that can assist in separation. Furthermore, the step S130 further includes: drying the strippable printing ink I in the shade or baking the strippable printing ink I, so that the strippable printing ink I is in a cured state, so as to facilitate the subsequent stripping operation.

Figure 4:
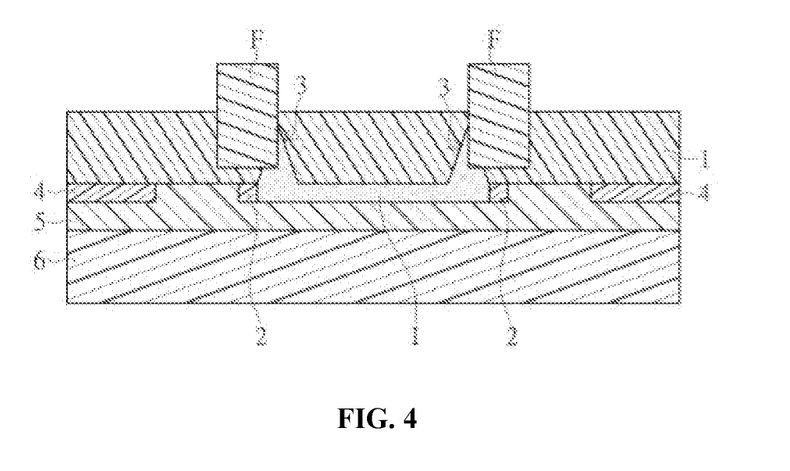
FIG. 4 is a schematic diagram of step S140 of the cover-opening method of the printed circuit board according to the embodiment of the present disclosure.

FIG. 4 is a schematic diagram of step S140 of the cover-opening method of the printed circuit board according to the embodiment of the present disclosure. The step S140 includes: performing a lamination process to laminate a build-up board structure onto the side surface of the core substrate 1 provided with the metal dam structure 2; and performing a blind routing operation to blind route the other side surface of the core substrate 1 by using a blind routing machine.

The build-up board structure includes a bonding sheet 5 (such as PP glue, also referred to as a prepreg) and a core board 6 (such as another core). The bonding sheet 5 is attached between the core substrate 1 and the core board 6 to adhere the core substrate 1 with the core board 6.

More specifically, one side surface of the bonding sheet 5 is attached onto the strippable printing ink I, the metal dam structures 2 and the metal circuit pattern 4, and the bonding sheet 5 is trapped in the gap (the part not located in the printing area R) between the metal dam structures 2 and the metal circuit pattern 4, so as to be further attached onto the core substrate 1. Furthermore, the other side surface of the bonding sheet 5 is attached to the core board 6.

Furthermore, in the blind routing operation, two blind routing milling cutters F are respectively aligned with the positions of the two laser cut grooves 3 so as to blind route from the other side surface of the core substrate 1. Each of the blind routing milling cutters F blind routes from the other side surface of the core substrate 1 towards the laser cut groove 3, and a blind routing range of each of the blind routing milling cutters F partially overlaps with the laser cut groove 3 so as to remove a part of the strippable printing ink I filled in the laser cut groove 3.

Furthermore, the blind routing depth for each of the blind routing milling cutters F is smaller than the thickness of the core substrate 1; that is, each of the blind routing milling cutters F does not penetrate through the core substrate 1 after the blind routing operation is finished.

Still referring to FIG. 4, in the present embodiment, each blind routing cutter F does not aim at the center line of a corresponding laser cut groove 3 for blind routing. Each of the blind routing cutters F performs blind routing at the position slightly deviates from the printing area R with regard to the center line of the corresponding laser cut groove 3, so as to facilitate the subsequent cover-opening operation. However, the present disclosure is not limited thereto.

Figure 5:
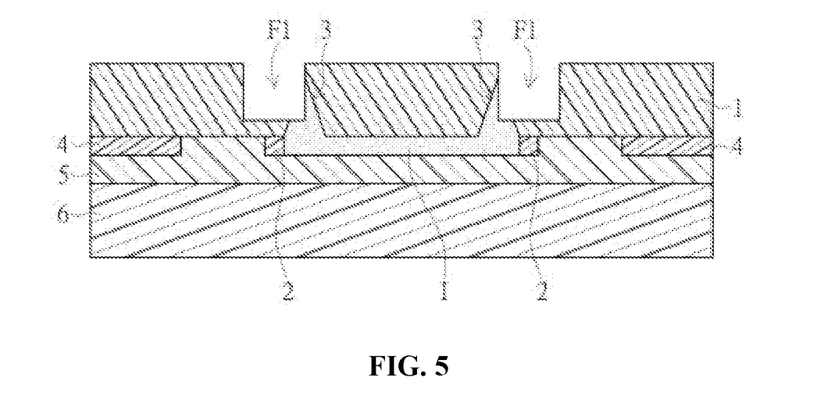
FIG. 5 is a schematic diagram of step S150 of the cover-opening method of the printed circuit board according to the embodiment of the present disclosure.

FIG. 5 is a schematic diagram of step S150 of the cover-opening method of the printed circuit board according to the embodiment of the present disclosure. The step S150 includes: removing the two blind milling cutters F to form two blind milling openings F1 in the core substrate 1. More specifically, the two blind routing openings F1 are recessed from the other side surface of the core substrate 1 towards the two metal dam structures 2, respectively, and having a shape complementary to that of the blind routing milling cutter. The blind routing ranges of the two blind routing openings F1 partially overlap with the two laser cut grooves 3, respectively, so as to partially remove the strippable printing ink I filled in the laser cut grooves 3. Furthermore, the blind routing ranges of the two blind routing openings F1 do not cover the metal dam structures 2.

Figure 6:
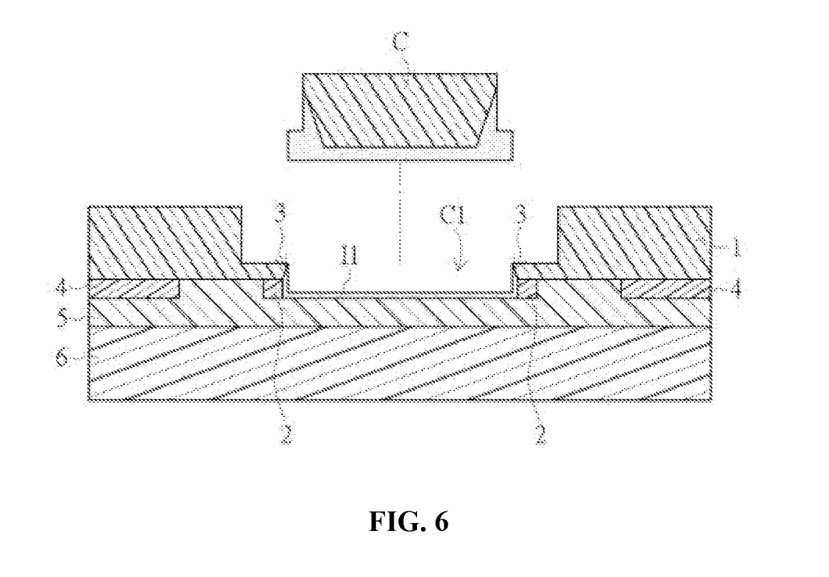
FIG. 6 is a schematic diagram of step S160 of the cover-opening method of the printed circuit board according to the embodiment of the present disclosure.

FIG. 6 is a schematic diagram of step S160 of the cover-opening method of the printed circuit board according to the embodiment of the present disclosure. Step S160 includes: performing a cover-opening operation to remove a cover-opening structure C of the core substrate 1 located between the two blind routing openings F1, thereby forming a cover-opening opening C1.

In the cover-opening operation, the cover-opening structure C located between the two blind routing openings F1 is separated from the build-up board structure (including the bonding sheet 5 and the core board 6) from the positions of the two laser cut grooves 3. The cover-opening structure C is Chinese character "冂"-shaped, but the present disclosure is not limited thereto.

More specifically, the cover-opening structure C includes a part of material of the core substrate 1 and a part of material of the strippable printing ink I, and the cover-opening structure C is separated from the build-up board structure from the positions of the two laser cut grooves 3 by the strippable printing ink I, thus forming a cover-opening opening C1 with a shape complementary to that of the cover-opening structure C.

After the cover-opening operation is completed, parts of the bottom of the cover-opening opening C1 that are located at the bonding sheet 5, the sidewalls of the metal dam structures 2 and the sidewalls of the laser cut grooves 3 have residual ink I1 left by the strippable printing ink I, which needs to be further removed by the following steps.

Figure 7:
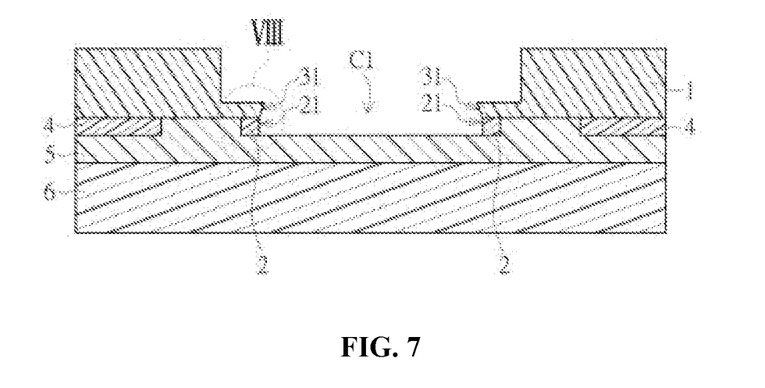
FIG. 7 is a schematic diagram of step S170 of the cover-opening method of the printed circuit board according to the embodiment of the present disclosure.

FIG. 7 is a schematic diagram of step S170 of the cover-opening method of the printed circuit board according to the embodiment of the present disclosure. The step S170 includes: performing a cleaning operation to remove the residual ink I1 located at the bottom of the cover-opening opening C1.

In the cleaning operation, the residual ink I1 located at the bottom of the cover-opening opening C1 is cleaned and removed by using chemical agent. The chemical agent may be, for example, a chemical agent containing modified alcohol ether, but the present disclosure is not limited thereto.

Figure 8:
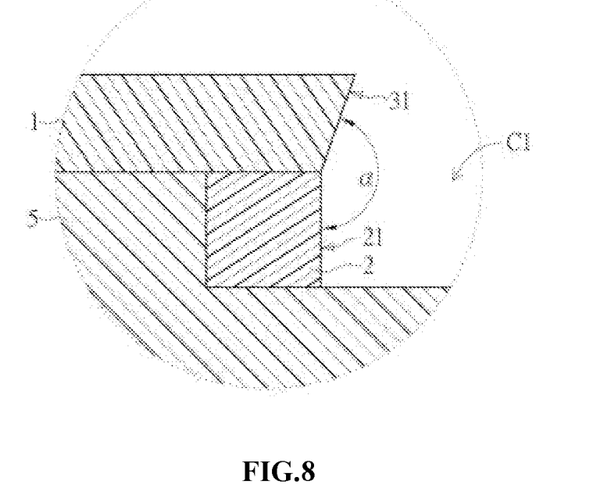
FIG. 8 is a partially enlarged schematic diagram of area VII in FIG. 7.

As shown in FIG. 8, the sidewall of each of the metal dam structures 2 facing the cover-opening opening C1 is defined as a metal dam sidewall 21, and the sidewall of each of the laser cut grooves 3 facing the cover-opening opening C1 is defined as a laser cutting sidewall 31. An included angle α is formed between the metal dam sidewall 21 and the laser cutting sidewall 31; the included angle α is preferably between 120 degrees and 150 degrees, and particularly preferably between 130 degrees and 140 degrees. For example, the included angle α may be 135 degrees.

Based on the included angle α between the metal dam sidewall 21 and the laser cutting sidewall 31, a flushing space can be formed between the metal dam sidewall 21 and the laser cutting sidewall 31. Therefore, the chemical agent can be sufficiently exchanged in the flushing space between the metal dam sidewall 21 and the laser cutting sidewall 31, so that the residual ink I1 located between the metal dam sidewall 21 and the laser cutting sidewall 31 can be sufficiently removed.

In the existing art, after the cover-opening operation in the manufacturing process of the circuit board, the strippable glue at the edge of the cover-opening opening may be mixed with the PP glue, and hence is difficult to be stripped off when cleaning. According to the cover-opening method of semi-flex printed circuit board provided by the embodiment of the present disclosure, the strippable printing ink I (i.e., the strippable glue) is no longer in contact with the edge of the bonding sheet 5 (i.e., the PP glue), and the blind routing opening F1 is directly abutted with the laser cut groove 3, so that the problem that the strippable glue is difficult to be stripped off can be solved.

In addition, in the existing art, an angle of the edge of the cover-opening opening is affected by laser, which results in liquid medicine exchange problem and a long time for stripping off the strippable glue; also, there is a risk that the strippable glue would be remained, which may affect the electrical characteristics of the finished circuit board. According to the cover-opening method of semi-flex printed circuit board provided by the embodiment of the present disclosure, the side edge of the strippable printing ink I (i.e., the strippable glue) is modified to be abutted with the metal dam structure 2 (i.e., the metal circuit), and the strippable printing ink I is relatively easier to be removed from the metal copper surface, thereby reducing the possibility of residue of the strippable printing ink I.

Furthermore, the method for manufacturing semi-flex printed circuit board according to the embodiment of the present disclosure can avoid the overflow of the strippable printing ink I in the printing process and assists in improving the stripping efficiency and clear-up effect to the strippable printing ink I in the subsequent stripping operation, by means of the design of the metal dam structure 2 and the laser cut groove 3. More specifically, the metal dam structures 2 can prevent the strippable printing ink I from overflowing during the printing process; the strippable printing ink I is filled in the laser cut grooves 3 during the printing process, which also assists in preventing the strippable printing ink I from overflowing from the positions of the metal dam structures 2. Moreover, the laser cut grooves 3 can assist in the subsequent stripping efficiency and clear-up effect to the strippable printing ink I.

Advantageous Effects of Embodiments

One of the beneficial effects of the present disclosure is that the method for manufacturing the semi-flex printed circuit board provided by the present disclosure can solve the problem that strippable printing ink is difficult to strip off and can reduce the possibility of the strippable printing ink residue by the technical solution of "forming two convex metal dam structures and two concave laser cut grooves on a side surface of the core substrate; wherein inner sides of the two metal dam structures form a printing area at the side surface of the core substrate, and the positions of the two laser cut grooves correspond to the printing area and are closely adjacent to the inner sides of the two metal dam structures respectively; printing a strippable printing ink in the printing area on the core substrate, wherein the strippable printing ink is capable of being filled in the two laser cut grooves during a printing process; laminating a build-up board structure on the side surface of the core substrate; and blind routing another side surface of the core substrate to form two blind routing openings, which correspond to the two laser cut grooves in position respectively; removing a cover-opening structure of the core substrate between the two blind routing openings, so as to form a cover-opening opening, and the cover-opening structure is separated from the build-up board structure from positions of the two laser cut grooves; and removing residual ink located at the bottom of the cover-opening opening".

The above disclosure is only a preferred and feasible embodiment of the present disclosure without limiting the claims of the present disclosure. Therefore, all equivalent technical changes made by using the contents of the present specification and drawings are included in the claims of the present disclosure.

What is claimed is:

1. A method for manufacturing a semi-flex printed circuit board, comprising:
   providing a core substrate;
   forming two metal dam structures convex from a side surface of the core substrate and two laser cut grooves concave from the side surface of the core substrate, wherein inner sides of the two metal dam structures form a printing area at the side surface of the core substrate, and the positions of the two laser cut grooves correspond to the printing area and are closely adjacent to the inner sides of the two metal dam structures respectively;
   printing a strippable printing ink in the printing area on the core substrate, wherein the strippable printing ink is capable of being filled in the two laser cut grooves during a printing process;
   laminating a build-up board structure on the side surface of the core substrate, and blind routing another side surface of the core substrate to form two blind routing openings, which correspond to the two laser cut grooves in position respectively;
   removing a cover-opening structure of the core substrate between the two blind routing openings, so as to form a cover-opening opening, and the cover-opening structure is separated from the build-up board structure from positions of the two laser cut grooves; and
   removing residual ink located at the bottom of the cover-opening opening;
   wherein the build-up board structure comprises a bonding sheet and a core board, and the bonding sheet is arranged between the core substrate and the core board, wherein a side surface of the bonding sheet is bonded to the strippable printing ink and the two metal dam structures, and is further trapped in a gap at outer sides of the two metal dam structures to be bonded to the core substrate, and another side surface of the bonding sheet is bonded onto the core board, so as to bond the core substrate and the core board together.

2. The method for manufacturing the semi-flex printed circuit board according to claim 1, wherein the two metal dam structures are formed by a metal etching operation, and the two laser cut grooves are formed by a laser cutting operation, a shape of each of the two metal dam structures is rectangular or trapezoidal, and a width of each of the two metal dam structures is between 30 microns and 600 microns, and a height of each of the two metal dam structures is between 15 microns and 300 microns.

3. The method for manufacturing the semi-flex printed circuit board according to claim 1, wherein the cover-opening structure comprises a part of the core substrate and a part of the strippable printing ink; and the cover-opening structure is separated from the build-up board structure from positions of the two laser cut grooves by the strippable printing ink, so as to form the cover-opening opening with a shape complementary to that of the cover-opening structure.

4. The method for manufacturing the semi-flex printed circuit board according to claim 1, wherein the residual ink is cleaned and removed by a chemical agent.

5. The method for manufacturing the semi-flex printed circuit board according to claim 1, wherein the two blind routing openings are formed by a blind routing operation; in the blind routing operation, two blind routing milling cutters are adopted to blind route at positions corresponding to the two laser cut grooves respectively in a direction from the another side surface of the core substrate towards the two laser cut grooves, and a blind routing range of each of the two blind routing milling cutter partially overlaps with the corresponding laser cut groove, so as to partially remove the strippable printing ink filled in the laser cut grooves; then, removing the two blind routing milling cutters to form the two blind routing openings on the core substrate; wherein blind routing depths of the two blind routing openings are both smaller than a thickness of the core substrate, and blind routing ranges of the two blind routing openings do not cover the two metal dam structures.

6. The method for manufacturing the semi-flex printed circuit board according to claim 5, wherein each of the two blind routing milling cutters performs blind routing at a position slightly deviated from the printing area with regard to a center line of the corresponding laser cut groove.

7. The method for manufacturing the semi-flex printed circuit board according to claim 1, wherein a sidewall of each of the two metal dam structures facing the cover-opening opening is defined as a metal dam sidewall, and a sidewall of each of the two laser cut grooves facing the cover-opening opening is defined as a laser cutting sidewall; wherein an included angle between the metal dam sidewall and the laser cutting sidewall is between 120 and 150 degrees.

8. The method for manufacturing the semi-flex printed circuit board according to claim 7, wherein the included angle is between 130 degrees and 140 degrees.

* * * * *